US009306341B2

(12) United States Patent
Wang et al.

(10) Patent No.: US 9,306,341 B2
(45) Date of Patent: Apr. 5, 2016

(54) POWER ADAPTER

(71) Applicant: Delta Electronics, Inc., Taoyuan Hsien (TW)

(72) Inventors: Guojun Wang, Taoyuan Hsien (TW); Baohua Li, Taoyuan Hsien (TW); Xiaojun Chen, Taoyuan Hsien (TW)

(73) Assignee: DELTA ELECTRONICS, INC., Taoyuan (TW)

(*) Notice: Subject to any disclaimer, the term of this patent is extended or adjusted under 35 U.S.C. 154(b) by 13 days.

(21) Appl. No.: 14/328,341

(22) Filed: Jul. 10, 2014

(65) Prior Publication Data

US 2015/0188265 A1 Jul. 2, 2015

(30) Foreign Application Priority Data

Dec. 30, 2013 (CN) ...................... 2013 2 0895513 U

(51) Int. Cl.

| | |
|---|---|
| ***H01R 12/00*** | (2006.01) |
| ***H05K 1/00*** | (2006.01) |
| ***H01R 13/66*** | (2006.01) |
| ***H01R 31/06*** | (2006.01) |

(52) U.S. Cl.

CPC .......... *H01R 13/665* (2013.01); *H01R 13/6675* (2013.01); *H01R 31/065* (2013.01)

(58) Field of Classification Search

CPC .......................... H01R 31/065; H01R 13/6675

USPC ................. 439/76.1, 620.18, 620.31, 620.21, 439/620.22, 620.25, 620.29, 620.15, 439/620.06, 620.13, 638, 202, 928.1

See application file for complete search history.

(56) References Cited

U.S. PATENT DOCUMENTS

| | | | | | |
|---|---|---|---|---|---|
| 6,149,452 | A * | 11/2000 | Chen | H04N 7/20 348/E7.093 |
| 6,776,650 | B2 * | 8/2004 | Cheng | H01R 13/6658 361/679.46 |
| 6,881,069 | B2 * | 4/2005 | Chen | H01R 39/64 362/647 |
| 2004/0110397 | A1 * | 6/2004 | Chen | H01R 31/065 439/75 |

* cited by examiner

*Primary Examiner* — Abdullah Riyami
*Assistant Examiner* — Harshad Patel
(74) *Attorney, Agent, or Firm* — CKC & Partners Co., Ltd.

(57) ABSTRACT

The present invention provided with a power adapter comprises a housing and a power conversion circuit board mounted in the housing. The housing comprises a body, which is a generally cylindrical shell having an accommodating space, an open end and an opposite closed end, wherein the closed end and the cylindrical shell are formed into a one-pieced, integrated structure, The housing also comprises a side dead wall mounted at and adapted to the open end. The power conversion circuit board has a first end connected to the side dead wall and a second end connected to the closed end, wherein the power conversion circuit board is fixedly accommodated within a confined space enclosed by the side dead wall and the body of the housing.

15 Claims, 5 Drawing Sheets

POWER ADAPTER

CROSS-REFERENCE TO RELATED APPLICATIONS

This non-provisional application claims priority of Chinese Patent Application No. 201320895513.4 filed in P. R. China on Dec. 30, 2013, the entire contents of which are hereby incorporated by reference.

FIELD OF THE INVENTION

The present invention relates to a power adapter, and particularly to a power adapter with an integrated housing, which meets requirements of safety specifications. The invention also relates to an assembly method of said power adapter.

BACKGROUND OF THE INVENTION

With advances in technology and the continuous development of industrial designs, power supply products have been developed towards the direction of high-level aesthetic perception, high reliability and high performance. In order to satisfy requirements of moulds and processes, housing of a traditional power supply is designed and configured to have an upper cover and a lower cover. With the reference of FIG. 1, which is a schematic view illustrating the structure of the power adapter in the prior art, internal components of the power adapter in the prior art are generally assembled by a way that a PCB (printed circuit board) and the components (not shown) are assembled within the lower cover 20, and then the upper cover 30 and the lower cover 20 being assembled together. It is necessary to allow an assembly tolerance due to the constraints of the assembling process. In such structure, a process gap 10 is generally formed at the junction of the upper cover 30 and the lower cover 20 along the periphery of the housing. The gap not only affects the aesthetics but also tends to introduce dusts, and therefore affecting work efficiency and even resulting in potential safety hazards.

The progress of the moulds and the improvement of the processes give chances to develop industrial designs of the power supplies. The improvement of the process has a significant influence to the improvement of the aesthetic appearances of the power supply products. To meet the aesthetic requirement of gapless, a one-piece design for the housing for the power supply has been applied. With the conventional one-piece design for the housing, however, the input and output terminals of the product usually cannot be effectively fixed, so that the requirements of safety specifications testing cannot be met.

SUMMARY OF THE INVENTION

An objective of the present invention is to provide a power adapter with an integrated housing, which meets the requirements of safety specifications, and an assembly method of said power adapter.

According to one aspect, the invention provides a power adapter comprising a housing and a power conversion circuit board mounted within the housing. The housing comprises a body, which is a generally cylindrical shell having an accommodating space, an open end and a closed end, wherein the closed end and the cylindrical shell are formed into a one-pieced, integrated structure. The housing further comprises a side dead wall mounted at and adapted to the open end. The power conversion circuit board has a first end connected to the side dead wall and a second end connected to the closed end, wherein the power conversion circuit board is fixedly accommodated within a confined space enclosed by the side dead wall together with the body of the housing.

The invention has following advantages.

1. The appearance of the integrated housing according to the invention can better satisfy the industrial design requirements, with a beautiful external look and without any assembling clearance in the product, thereby avoiding the introduction of dust and other safety hazards.
2. The integrated housing can effectively increase the overall strength of the power adapter;
3. The internal components of the power adapter are fixed as a whole before they are assembled into the integrated housing. Thereby, the reliability and stability of operation of the power adapter are effectively improved.
4. The integrated housing is configured that both of its front and rear ends are fixed to the PCB, so that the requirements of safety specifications are met. The PCB will never fall out of the housing even when the power adapter is dropped vertically from high. It is because no matter which end of the housing touches the ground first, the PCB is fixed with the other end of the housing, avoiding falling off or sliding out.

Hereinafter, the present invention is described in detail with reference to the accompanying drawings and embodiments, which, however, are not used to limit the invention.

DETAILED DESCRIPTION OF THE PREFERRED EMBODIMENT

Principle, structure and operation of the invention will now be described in details through following illustrative embodiments. However, it should be understood that an element, a structure or a feature in an embodiment can be beneficially incorporated into other embodiments without further recitation.

Some references, if any, which may include patents, patent applications and various publications, may be cited and discussed in the description of this invention. The citation and/or discussion of such references, if any, is provided merely to clarify the description of the invention and is not an admission that any such reference is “prior art” to the invention described herein. All references listed, cited and/or discussed in this specification are incorporated herein by reference in their entireties and to the same extent as if each reference was individually incorporated by reference.

It should also be understood that "comprises/comprising" when used in the specification is taken to specify the presence of stated features, integers, steps or components but dose not preclude the presence or addition of one or more other features, integers, steps or components or groups thereof.

Figure 1:
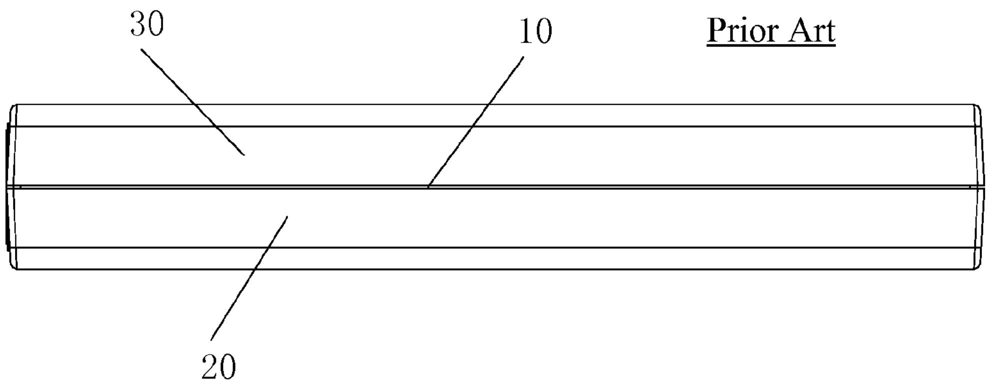
FIG. 1 is a schematic view illustrating the structure of the power adapter in the prior art.
Figure 2A:
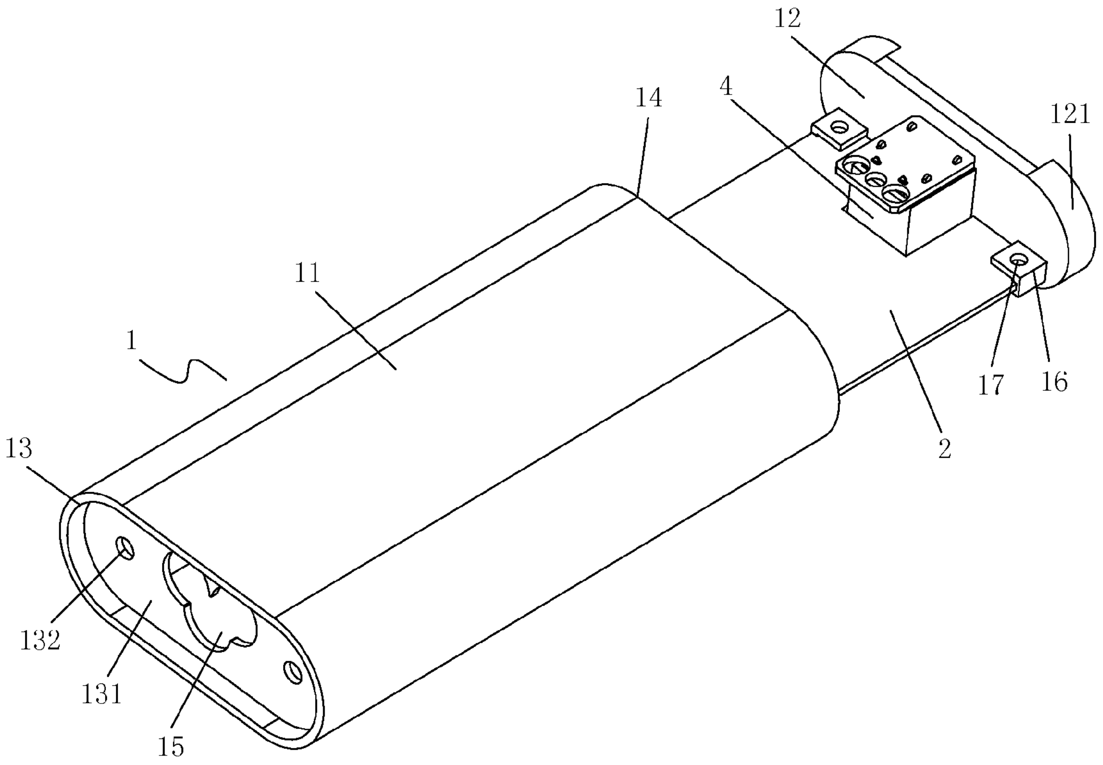
FIG. 2A is a schematic view illustrating the structure of the power adapter according to an embodiment of the invention, which is not fully assembled.
Figure 2B:
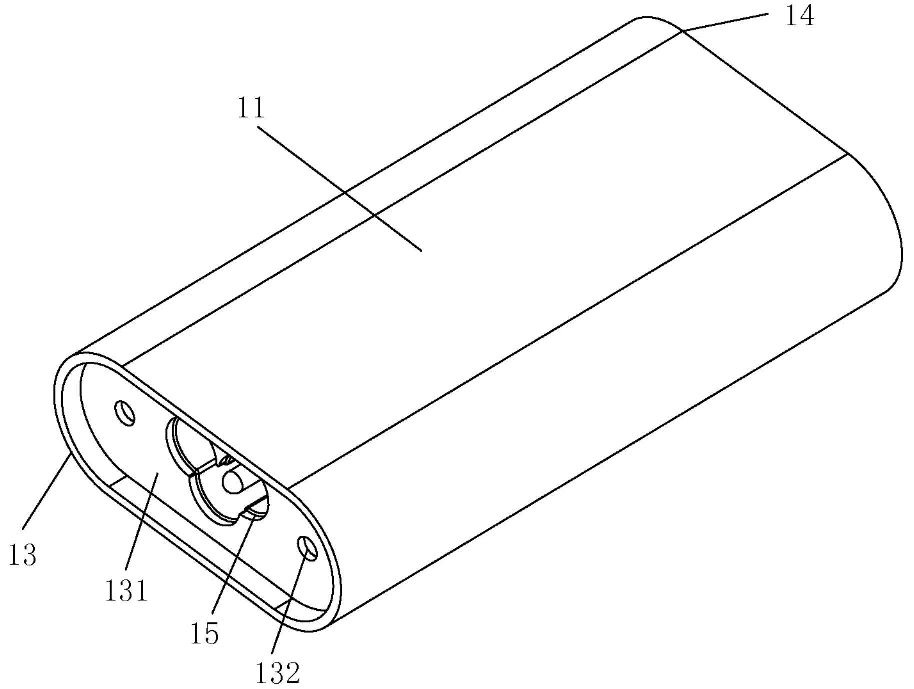
FIG. 2B is a schematic view illustrating the structure of the power adapter according to an embodiment of the invention, which is fully assembled.

FIG. 2A is a schematic view illustrating the structure of the power adapter according to an embodiment of the invention, which is not fully assembled. FIG. 2B is a schematic view illustrating the structure of the power adapter according to an embodiment of the invention, which is fully assembled. Referring to FIGS. 2A and 2B, a power adapter according to the invention comprises a housing 1 having a body 11 and a side dead wall 12, and a power conversion circuit board 2 mounted within the housing 1.

Figure 8:
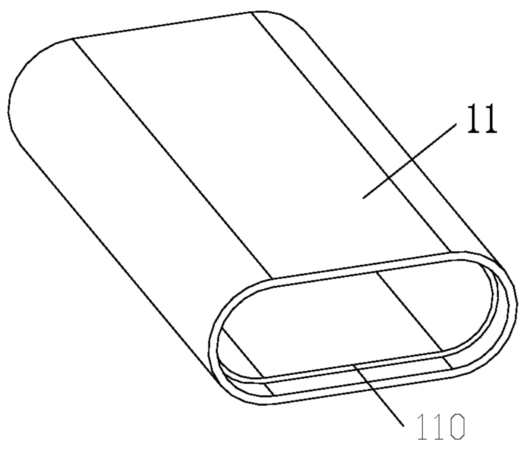
FIG. 8 is a schematic view illustrating the structure of the body of the housing according to an embodiment of the invention.

The body 11 of the housing is a generally cylindrical shell having an accommodating space. The cylindrical shell has a cross section of, e.g., rectangular, oblate, circular or oval shape or the like, and has an appearance shape that can be designed differently depending on practice needs. The body 11 has two opposite ends, which are a closed end 13 and an open end 14, respectively. A closed surface 131 of the closed end 13 and the body 11 are in a one-pieced, integrated structure. The closed surface 131 of the closed end 13 is set as an input interface 3 of the power conversion circuit board 2. The closed end 13 is provided with an input hole 15. To facilitate mounting and positioning so as to increase the efficiency of assembly and production, a positioning shoulder 110 for mounting and positioning the side dead wall 12 (FIG. 4 and FIG. 8) can be arranged at the inner side of the body 11 closely to the open end 14. In another embodiment, the closed surface 131 of the closed end 13 can be set as an output interface of the power conversion circuit board 2.

The side dead wall 12 is mounted at the open end 14 and is adapted to the open end 14. The power conversion circuit board 2 has a first end connected to the side dead wall 12, and a second end connected to the closed end 13. The power conversion circuit board 2 is fixedly accommodated within a confined space 100 enclosed by the side dead wall 12 and the body 11 of the housing together.

In this embodiment, an inner side of the side dead wall 12 is provided with at least a connecting piece 16 for mounting the power conversion circuit board 2. The connecting piece 16 can be arranged to be in an integrated, one-pieced structure with the side dead wall 12. The connecting piece 16, for example, can be of a boss arranged at a lower portion of the inner side of the side dead wall 12, seeing FIG. 3 to FIG. 7. The first end of the power conversion circuit board 2 is fixed to the boss. In the figures, two bosses are illustrated in a symmetrical arrangement. Each boss has a connecting plane provided with a fixing hole 17, through which the power conversion circuit board 2 is fixedly connected to the boss. At least one of the bosses can have a cross section of a line-shaped, L-shaped or U-shaped structure. Alternatively, the connecting piece 16 can be of a groove (not shown) arranged at the lower portion of the inner side of the side dead wall 12, in which the first end of the power conversion circuit board 2 can be plugged and fixed.

Figure 3:
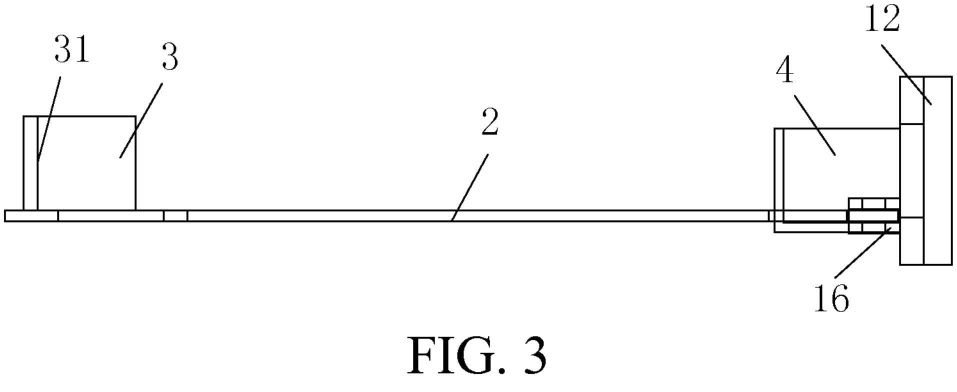
FIG. 3 is a sectional view illustrating the assembly structure of the printed circuit board according to an embodiment of the invention.
Figure 4:
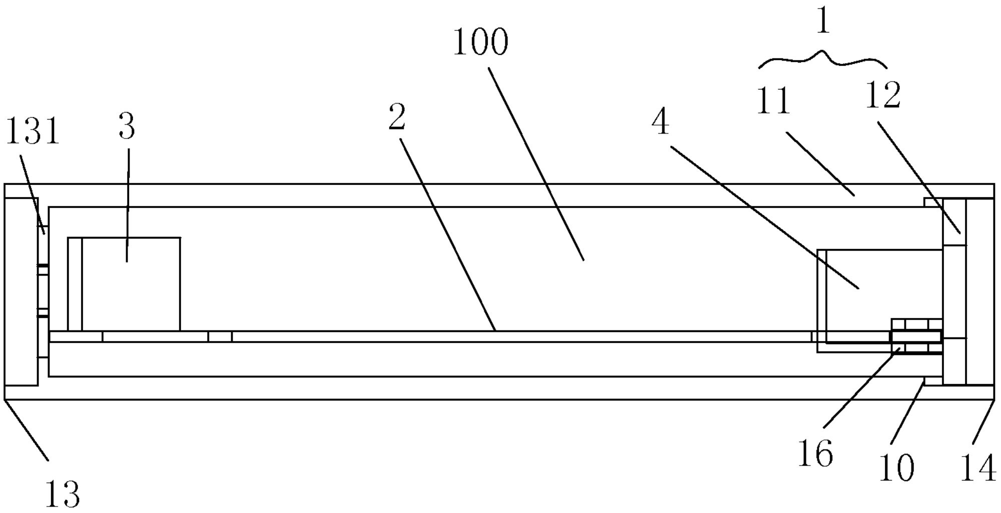
FIG. 4 is a sectional view of the power adapter according to an embodiment of the invention.
Figure 6:
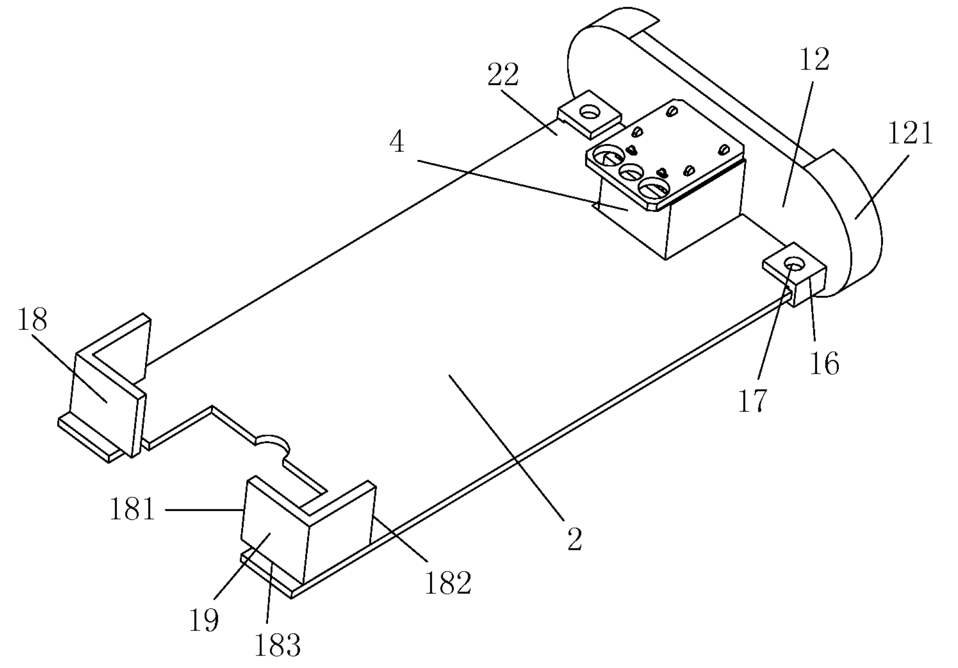
Figure 7:
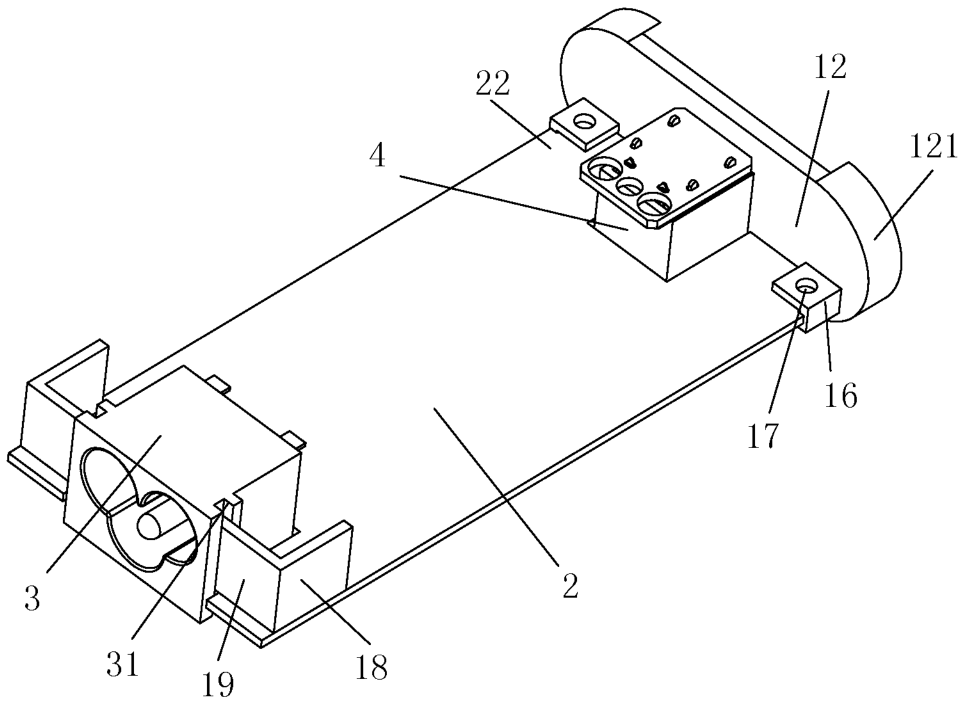

FIG. 3 is a sectional view illustrating the assembly structure of the printed circuit board according to an embodiment of the invention. FIG. 4 is a sectional view of the power adapter according to an embodiment of the invention. Referring to FIGS. 3-4 and 6-7, in an embodiment of the invention, the power adapter further comprises at least a housing connecting piece (second connecting piece) 18. The housing connecting piece 18 can be mounted at the end of the power conversion circuit board 2 that is connected to the input interface 3. Of course, in another embodiment, the housing connecting piece 18 can be mounted at the end corresponding to the output interface of the power conversion circuit board 2. In this embodiment, two housing connecting pieces 18 are arranged symmetrically at the second end of the power conversion circuit board 2. In the example where the housing connecting pieces 18 are mounted at the end corresponding to the input interface 3, the housing connecting pieces 18 can be of metal sheets arranged on two sides of the input interface 3, respectively. The metal sheets may be of aluminum sheets, iron sheets, copper sheets or the like. One end of the metal sheet is configured as a fixed end 181, which is mounted to the input interface 3, preferably, in a manner of slot-insertion joint. Both sides of the input interface 3 are correspondingly provided with slots 31 for connecting with the fixed ends 181 referring to as the insertion. A base side 183 of the metal sheet can be fixed to the power conversion circuit board 2 by screwing, riveting, or other kind of solid joint types. Each of the metal sheets has a fixed connecting portion 19 at a position close to the fixed end 181, for connecting with the closed surface of the closed end 13. The fixed connecting portion 19 is arranged in parallel with the closed surface 131 of the closed end 13, and can be provided with a connecting hole (not shown) for fixedly connecting the closed surface 131 of the closed end 13. The connecting hole in the fixed connecting piece 19 can be a threaded hole. A fixing hole 132 can be arranged at a corresponding position of the closed end 13 of the cylindrical shell. According to an embodiment of the power adapter, the fixed connection between the body 11 of the housing and one end of the power conversion circuit board 2 can be achieved by connecting the closed end 13 of the body 11 to the housing connecting pieces 18 on the power conversion circuit board 2 through fastening screws. The housing connecting piece 18 may be bent at right angle and fixed to an input end of the power conversion circuit board 2, as shown in FIG. 6 and FIG. 7; and may also be of a structure of a curved reed or a flap. There is no limitation to the structure of the housing connecting piece 18.

The closed surface 131 of the closed end 13 of the cylindrical shell may be flushed with and end surface of said closed end 13, or may be depressed with respect to the end surface of said closed end 13 (seeing FIGS. 2A and 2B). In another embodiments, the power adapter may further comprise an insulating patch (not shown) at the closed end, which matches and adheres to the closed surface 131, in order to take the effect of insulating the screws in the body 11 as described in the above embodiment(s) and/or meet the aesthetic requirements.

Similarly, the side dead wall 12 can be arranged to cover the outer edge of the open end 14 of the body 11, or be depressed from the end plane of the open end 14. In an embodiment of the power adapter, the edge 121 of the side dead wall 12 is structured and configured into a flange perpendicular to the wall plane of the side dead wall 12. In this embodiment, preferably, the edge 121 of the side dead wall 12 is depressed from the end plane of the open end 14, while the closed surface 131 is depressed from the end plane of the closed end 13 of the body 11, so that to making the overall structure compact and beautiful. Corresponding to the depressed structure of the side dead wall 12 from the end plane of the open end 14 of the body 11, the positioning shoulder 110 for mounting and positioning the side dead wall 12 is arranged at the inner side of the body 11 near the open end (see FIG. 8).

Figure 5:
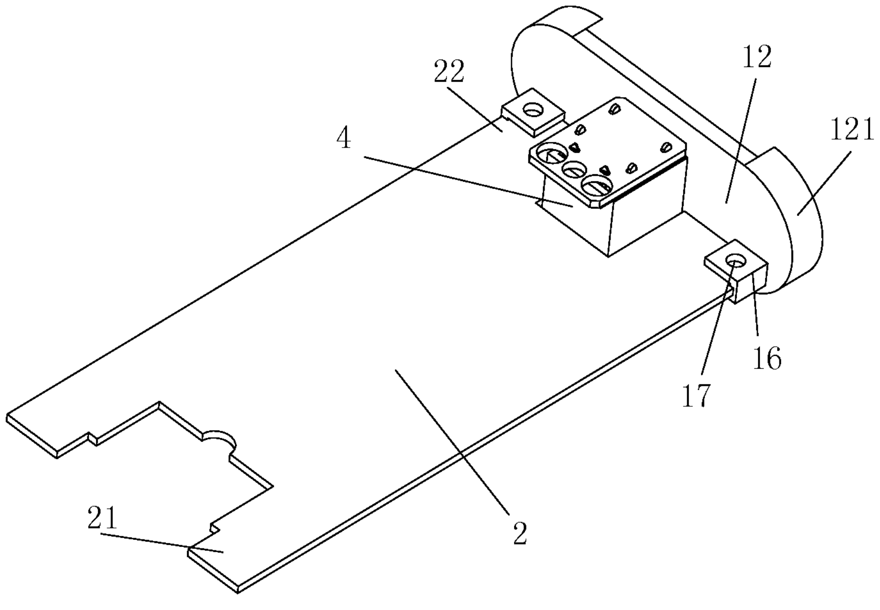
FIGS. 5 to 7 are schematic views showing the assembling processes according to an embodiment of the invention.

The assembly process of the invention is described in detail in a specific embodiment hereinafter. It can be clearly seen that the invention offers a design of the one-pieced, integrated housing, and gives the product a nicer look. FIGS. 5 to 7 are schematic views illustrating the assembling process in one embodiment of the invention. In one embodiment, the output interface 4 is mounted at an output terminal 22 of the power conversion circuit board (such as a PCB) 2. The output terminal 22 of the power conversion circuit board 2 is fixed to the side dead wall 12 of the housing 1 by, e.g., screwing, locking, or a combination of two or more of the foregoing without exclusion of other suitable fixation methods (seeing FIG. 5). Then, the input terminal 21 of the power conversion circuit board 2 is fixed to the input interface (e.g. AC Jack) 3 by screwing, locking, or a combination of two or more of the foregoing without exclusion of other suitable fixation methods. The input interface 3 is provided at its both sides with the housing connecting pieces 18, respectively, which are fixed to the input interface 3 by slot-insertion or other suitable fixation methods. The bottom of each of the connecting pieces 18 can be provided with one or more pins for being fixed to the power conversion circuit board 2 by soldering (seeing FIG. 6). At this time, the input interface 3, the power conversion circuit board 2, the output interface 4 and the side dead wall 12 become integrated (seeing FIG. 7). Then, they are inserted as a whole into the body 11 through the open end 14 of the body 11 of the housing 1, and the side dead wall 12 can be fixed and connected to the cylindrical body 11. Here, an example of a fixed connection method is provided. In such example, the edge of the side dead wall 12 that contacts the positioning shoulder 110 of the body 11 is configured to have an uneven contact surface, while the positioning shoulder 110 are correspondingly configured and adapted to engage with the uneven contact surface of the side dead wall 12. In an embodiment, both the side dead wall 12 and the body 11 are made from plastic materials, which can be connected together by melting and curing by means of ultrasonic. Of course, in another embodiment, the side dead wall 12 and the body 11 can also be connected with each other by other methods, such as screwing, hooking, or the like. Finally, one or more fixing member can pass through the fixing holes 132 of the closed end 13 and the connecting hole of the housing connecting piece 18 to connect the housing connecting piece 18 with the closed end 13 of the housing 1. Thus, the housing connecting pieces 18 are fixed to the closed end 13 through the fixing holes 132, so that the product can be fixed into a whole (seeing FIG. 2B).

According to the invention, the AC Jack, the PCB and the output terminal are firstly fixed into a whole and then assembled into and fixed to the housing. The invention may have following advantages:

1. The appearance of the product can better satisfy the industrial design requirements without any assembling gap in the product.
2. The housing is integrated so that the overall strength of the product is increased;
3. The internal components of the product have been fixed into a whole before they are assembled into the housing, so that the reliability of the product is improved.
4. Both the front and rear ends are fixed to the PCB, so that the requirements of the safety specifications are met. The PCB plate will never fall out of the housing even if the housing is dropped vertically from high.

Although several preferred embodiments of the present invention have been described, the present invention may be used with other configurations. It will be appreciated by those skilled in the art that, the present invention could have many other embodiments, and changes and modifications may be made thereto without departing from the invention in its broader aspects and as set forth in the following claims and equivalents thereof.

What is claimed is:

1. A power adapter comprising:

a housing including:

a body, which is a generally cylindrical shell having an accommodating space, an open end and an opposite closed end, wherein the closed end and the cylindrical shell are formed into a one-pieced, integrated structure; and a side dead wall mounted at the open end and adapted to the open end;

a power conversion circuit board, which is mounted within the housing and has a first end connected to the side dead wall and a second end connected to the closed end, wherein the power conversion circuit board is fixedly accommodated within a confined space enclosed by the side dead wall and the body of the housing;

a housing connecting piece, arranged at an end of the power conversion circuit board; and wherein the housing connecting piece is arranged on two sides of an input interface or on two sides of an output interface, and one end of the housing connecting piece is configured as a fixed end, which is mounted to a side of the input interface or the output interface.

2. The power adapter according to claim 1, wherein the inner side of the side dead wall is provided with a connecting piece adapted for mounting the power conversion circuit board, wherein the connecting piece and the side dead wall are arranged into an integrated structure.

3. The power adapter according to claim 2, wherein the connecting piece is a boss arranged at the lower portion of the inner side of the side dead wall, the first end of the power conversion circuit board being fixed to the boss.

4. The power adapter according to claim 3, wherein two of said bosses are symmetrically arranged, and each has a connecting plane provided with a fixing hole adapted for fixing and connecting the power conversion circuit board.

5. The power adapter according to claim 3, wherein the cross section of the boss is configured into a line-shaped, L-shaped or U-shaped structure.

6. The power adapter according to claim 2, wherein the connecting piece is configured into a groove arranged at the lower portion of the inner side of the side dead wall, the first end of the power conversion circuit board being plugged into the groove.

7. The power adapter according to claim 1, further comprising a housing connecting piece, arranged at the second end of the power conversion circuit board.

8. The power adapter according to claim 7, wherein two of said housing connecting pieces are symmetrically arranged at the second end of the power conversion circuit board.

9. The power adapter according to claim 7, wherein the housing connecting piece is provided with a connecting hole, while the closed end is provided with a corresponding fixing hole.

10. The power adapter according to claim 9, comprising a fixing member adaptable for passing through the fixing hole of the closed end and the connecting hole of the housing connecting piece to connect the housing connecting piece with the closed end of the housing.

11. The power adapter according to claim 1, wherein the closed surface of the closed end of the cylindrical housing is flush with the end plane of said closed end.

12. The power adapter according to claim 1, wherein the closed surface of the closed end of the cylindrical housing is depressed from the end plane of said closed end.

13. The power adapter according to claim 12, further comprising an insulating patch adapted to match the closed surface, wherein the insulating patch is adhered to the closed surface.

14. The power adapter according to claim 1, further comprising a positioning shoulder which is adapted for mounting and positioning the side dead wall and arranged at the inner side of the housing body near the open end.

15. The power adapter according to claim 1, wherein the fixed end of the metal sheet is connected with a slot provided correspondingly on the side of the input interface or the output interface in a manner of slot-insertion joint.

* * * * *